(12) United States Patent
Mizutani et al.

(10) Patent No.: US 8,941,377 B2
(45) Date of Patent: Jan. 27, 2015

(54) OPTICALLY PUMPED MAGNETOMETER AND MAGNETIC SENSING METHOD

(71) Applicant: Canon Kabushiki Kaisha, Tokyo (JP)

(72) Inventors: Natsuhiko Mizutani, Tokyo (JP); Tetsuo Kobayashi, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 203 days.

(21) Appl. No.: 13/725,840

(22) Filed: Dec. 21, 2012

(65) Prior Publication Data

US 2013/0207649 A1  Aug. 15, 2013

(30) Foreign Application Priority Data

Feb. 10, 2012  (JP) .................... 2012-026919
Apr. 23, 2012  (JP) .................... 2012-097671

(51) Int. Cl.
*G01R 33/02*  (2006.01)

(52) U.S. Cl.
USPC ............................................. 324/244.1

(58) Field of Classification Search
USPC ............................................... 324/244.1
See application file for complete search history.

(56) References Cited

U.S. PATENT DOCUMENTS

| | | | |
|---|---|---|---|
| 6,141,170 A | 10/2000 | Hatae et al. | |
| 6,586,725 B2 | 7/2003 | Mizutani et al. | |
| 6,603,557 B2 | 8/2003 | Mizutani | |
| 6,785,003 B2 | 8/2004 | Mizutani et al. | |
| 7,251,741 B2 | 7/2007 | Kobayashi et al. | |
| 7,456,523 B2 | 11/2008 | Kobayashi | |
| 8,067,854 B2 | 11/2011 | Kobayashi | |
| 2013/0278253 A1* | 10/2013 | Ichihara et al. | ............... 324/304 |
| 2014/0097837 A1* | 4/2014 | Takahashi | ..................... 324/304 |

FOREIGN PATENT DOCUMENTS

| JP | 2009-14708 A | 1/2009 |
|---|---|---|
| JP | 2011-106968 A | 6/2011 |

OTHER PUBLICATIONS

JP2001-106968 Machine Translation by JPO, p. 1-13.*
Mizutani, N. et al., Magnetic field vector detection in frequency domain with an optically pumped atomic magnetometer, IEEE Trans. on Magnetics, V. 48, No. 11, Nov. 2012, p. 4096-4100.*
U.S. Appl. No. 13/814,231, filed Feb. 4, 2013. Applicant: Natsuhiko Mizutani, et al.
U.S. Appl. No. 13/860,299, filed Apr. 10, 2013. Applicant: Sunao Ichihara, et al.

* cited by examiner

*Primary Examiner* — Thomas F Valone
(74) *Attorney, Agent, or Firm* — Fitzpatrick, Cella, Harper & Scinto

(57) ABSTRACT

An optically pumped magnetometer and a magnetic sensing method acquire information as to strengths of magnetic fields in two different directions. A pump light having a circularly polarized component, first probe light having a liner polarized component and second probe light having a linearly polarized component are emitted to a cell containing a group of alkali metal atoms so as to form a crossing region A magnetic field applying unit applies a static magnetic field in a direction of the pump light incident on the crossing region during the emission of the pump light, the first probe light and the second probe light. And, information as to strengths of magnetic fields in two different directions perpendicular to the direction of the static magnetic field in the cell from the rotation angles of a polarization planes of the first and second probe lights during passage through the cell is calculated.

14 Claims, 10 Drawing Sheets

OPTICALLY PUMPED MAGNETOMETER AND MAGNETIC SENSING METHOD

BACKGROUND OF THE INVENTION

1. Field of the Invention

The present invention relates to an optically pumped magnetometer and a magnetic sensing method.

2. Description of the Related Art

Optically pumped magnetometers using electron spins of alkali metal gas are known. For example, in Japanese Patent Application Laid-Open No. 2009-14708, an atomic magnetometer whose probe light beam is given from one direction is proposed. In Japanese Patent Application Laid-Open No. 2011-106968, a magnetic measurement apparatus whose probe light beam is given from two directions to acquire magnetic information. However, conventional optically pumped magnetometers have the following problems.

The optically pumped magnetometers whose probe light beam is given from one direction, such as the one disclosed in Japanese Patent Application Laid-Open No. 2009-14708, can acquire only information as to a magnetic field in one direction. Japanese Patent Application Laid-Open No. 2011-106968 provides no specific disclosure of acquisition of magnetic information using the magnetic measurement apparatus that whose probe light beam is given from two directions nor clearly shows the magnetic information acquired.

There is no known optically pumped magnetometer that acquires information as to strengths of magnetic fields in two different directions.

In view of the problems described above, an object of the present invention is to provide an optically pumped magnetometer capable of acquiring information as to strengths of magnetic fields in two different directions and a magnetic sensing method therefor.

SUMMARY OF THE INVENTION

According to an aspect of the present invention, an optically pumped magnetometer acquiring an information as to strengths of magnetic fields in different two directions comprises: a cell including a group of alkali metal atoms; a pump light optical system configured to direct a pump light containing a circularly polarized component incident in the cell; a first probe light optical system configured to direct a first probe light containing a linearly polarized component so as to cross the pump light within the cell; a second probe light optical system configured to direct a second probe light containing a linearly polarized component so as to cross the pump light and the first probe light within the cell; a first detector configured to detect a rotation angle of the plane of polarization of the first probe light after passing through the cell; a second detector configured to detect a rotation angle of the plane of polarization of the second probe light after passing through the cell; a magnetic field applying unit configured to apply a static magnetic field within the cell; and a calculating unit configured to calculate the information as to the strengths of magnetic fields in the different two directions respectively vertical to the direction of the static magnetic field applied by the magnetic field applying unit within the cell, based on the rotation angle detected by the first detector and the rotation angle detected by the second detector.

According to a further aspect of the present invention, an magnetic sensing method for acquiring an information as to strengths of magnetic fields in different two directions comprising steps of: directing a pump light containing a circularly polarized component, a first probe light containing a linearly polarized component and a second probe light containing a linearly polarized component, to form a crossing region there between in a cell including a group of alkali metal atoms; applying, by magnetic field applying unit, a static magnetic field in a direction of the pump light incident in the crossing region, during the directing the pump light, the first probe light and the second probe light; and calculating the information as to strengths of magnetic fields in the different two directions vertical to the direction of the static magnetic field applied by the magnetic field applying unit within the cell, based on the rotation angle of the plane of polarization of the first probe light and the rotation angle of the plane of polarization of the second probe light during passing through the cell.

The present invention provides an optically pumped magnetometer capable of acquiring information as to strengths of magnetic fields in two different directions and a magnetic sensing method therefor.

Further features of the present invention will become apparent from the following description of exemplary embodiments with reference to the attached drawings.

DESCRIPTION OF THE EMBODIMENTS

Figure 1:
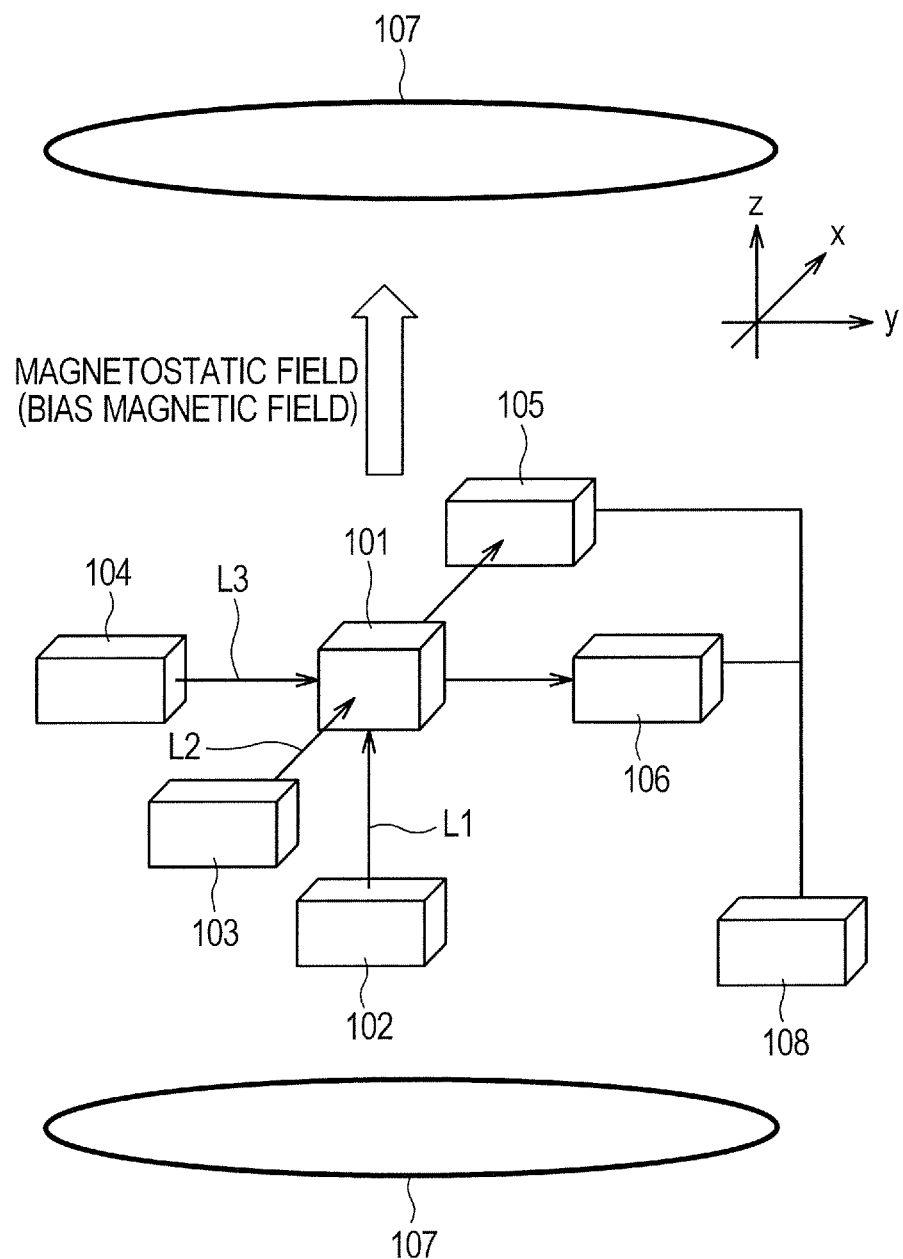
FIG. 1 is a diagram for illustrating a configuration of an optically pumped magnetometer according to Embodiment 1 of the present invention.

Preferred embodiments of the present invention will now be described in detail in accordance with the accompanying drawings.

In the following, embodiments of the present invention will be described. However, the present invention is not limited to these embodiments in any sense.

Embodiment 1

An optically pumped magnetometer according to Embodiment 1 includes the following components. The optically pumped magnetometer includes a cell containing a group of alkali metal atoms, a pump light optical system that launches pump light having a circularly polarized component into the cell, a first probe light optical system that launches first probe light having a linearly polarized component into the cell so as to cross the pump light in the cell, and a second probe light optical system that emits second probe light having a linearly polarized component so as to cross the pump light and the first probe light in the cell. The optically pumped magnetometer further includes a first detector that detects the rotation angle of the plane of polarization of the first probe light having passed through the cell, and a second detector that detects the rotation angle of the plane of polarization of the second probe light having passed through the cell. The optically pumped magnetometer further includes a magnetic field applying unit that applies a static magnetic field to the cell, and a calculating unit that calculates information as to strengths of magnetic field in two different directions perpendicular to the direction of the static magnetic field applied by the magnetic field applying unit. The calculating unit solves a Bloch equation using sampled data on the rotation angle detected by the first detector and the rotation angle detected by the second detector on the assumption that the spin polarization in the direction of the static magnetic field is constant. In this way, the information as to the strengths of the magnetic fields in the two different directions is calculated. A magnetic sensing method according to an embodiment includes the following steps.

That is, the magnetic sensing method includes a step of emitting pump light having a circularly polarized component, first probe light having a liner polarized component and second probe light having a linearly polarized component to a cell containing a group of alkali metal atoms so as to form a crossing region, and a step of applying, by a magnetic field applying unit, a static magnetic field in a direction of the pump light incident on the crossing region during the emission of the pump light, the first probe light and the second probe light. The magnetic sensing method further includes a step of calculating information as to strengths of magnetic fields in two different directions perpendicular to the direction of the static magnetic field applied by the magnetic field applying unit in the cell from the rotation angle of the plane of polarization of the first probe light and the rotation angle of the plane of polarization of the second probe light during passage through the cell. The optically pumped magnetometer and the magnetic sensing method according to embodiments can acquire information as to strengths of magnetic fields in two different directions at the same time.

In the following, a method of calculating information as to strengths of magnetic fields in two directions with an optically pumped magnetometer according to this embodiment described above will be briefly described with reference to FIG. 1. A pump light optical system 102 emits pump light L1 having a circularly polarized component to a group of alkali metal atoms (atom group) contained in a cell 101. A first probe light optical system 103 and a second probe light optical system 104 emit probe light L2 and L3 having a linearly polarized component, respectively. The pump light L1 and the probe light L2 and L3 are emitted so as to cross each other in the cell (or so as to have a crossing region). A first detector 105 and a second detector 106 acquire measurement information as to rotation angles of the polarization planes (rotation angles of the polarization directions) of the probe light L2 and L3 during passage of the probe light through the cell.

The pump light L1 and the probe light L2 and L3 are emitted in a state where a magnetic field applying unit 107 applies a static magnetic field in the direction in which the pump light L1 is launched into the crossing region. Thus, information as to a change of the rotation angles of the polarization planes of the probe light L2 and L3 during passage of the probe light through the cell is acquired. The static magnetic field applied by the magnetic field applying unit 107 is sometimes referred to as a bias magnetic field. The information as to the rotation angles of the polarization planes (rotation angles of the polarization directions) acquired by the first detector 105 and the second detector 106 are sent to a calculating unit 108, which can calculate information as to strengths of magnetic fields in two directions perpendicular to the direction of application of the static magnetic field.

To calculate the information as to the strengths of magnetic fields in two directions from the information as to the rotation angles of the polarization planes (rotation angles of the polarization directions), the Bloch equation described later has to be solved. To solve the Bloch equation, two approximations are performed. One approximation is to consider the spin polarization in the direction of the static magnetic field constant. The other approximation is to use the sampled data on the rotation angles detected by the first and second detectors to express the rotation angle in the Bloch equation, which is an unknown parameter. These approximations allow the optically pumped magnetometer according to this embodiment to calculate the strengths of magnetic fields in two directions.

Next, the cell according to this embodiment will be described. The cell is made of a material that can transmit the probe light and the pump light, such as glass and plastics. The cell contains a gas of an alkali metal (such as K and Rb) as a group of atoms (atom group). Of course, what is essential is that the alkali metal is in the gas (vapor) state when sensing occurs, and the alkali metal does not need to be always in the gas state. For example, potassium metal can be placed in a glass cell and then heated to about 180° C., thereby filling the glass cell with a vapor of potassium metal. Furthermore, the cell can encapsulate a gas serving as a buffer in addition to the group of atoms. The group of atoms may not be pure K or Rb and may be a mixture of these atoms and other atoms, such as Xe, capable of spin exchange with these atoms.

Next, the pump light will be described. The pump light is desirably circularly polarized light, that is, composed only of a circularly polarized component. However, according to this embodiment of the present invention, the pump light can contain other polarized components as far as the pump light contains the circularly polarized component. The pump light is used to align the directions of unpaired electron spins of the atoms forming the group of atoms. More specifically, a phenomenon referred to as circular polarization pumping can be used to align the directions of the spins of the atoms. Right-hand circularly polarized pump light can align the random directions of spins of atoms in the direction of traveling of the pump light. Left-hand circularly polarized pump light can align the directions of spins of atoms in the direction opposite to the direction of traveling of the pump light. The directions of spins can be aligned in this way because of the law of conservation of angular momentum of light and an electron. There is a direction of a spin in which no light absorption occurs because the law of conservation of angular momentum would not be satisfied if light absorption occurred. Although atoms once excited emit randomly polarized light by spontaneous emission and can be in different ground states, the directions of the spins of the atoms forming the group of atoms can be eventually aligned with each other by repeating the pumping.

Next, the first probe light and the second probe light will be described. The first probe light and the second probe light (referred to simply as probe light in this section) are desirably detuned from the resonance frequency of the atoms in order to avoid unnecessary pumping. Although the probe light is desirably composed only of a linearly polarized component, the probe light may contain other polarized components as far as the probe light contains the linearly polarized component according to this embodiment of the present invention. The probe light and the pump light are emitted so as to cross each other to form the crossing region. Although the probe light and the pump light can cross each other in any manner, typically, the probe light and the pump light preferably perpendicularly cross each other. As known, when linearly polarized light is incident on a group of polarized atoms, the polarization planes of the atoms rotate because of an effect referred to as the paramagnetic Faraday effect. The role of the probe light is to read the spin polarization of the group of atoms by taking advantage of this effect.

In this embodiment, the pump light described above is used to form a group of polarized atoms, the linearly polarized probe light is launched into the group of atoms in the cell, and information as to the rotation angle of the polarization plane of the probe light during passage of the light through the cell is acquired. For example, the rotation angle of the polarization plane of the probe light is measured. As for the light source, separate light sources may be used for the pump light and the probe light, or a common light source may be used, and a polarizing plate or the like may be used to produce the circularly polarized pump light and the linearly polarized probe light. The light source(s) for emitting the pump light and the probe light may be laser light source(s). For example, in the case where the group of atoms or the atom group in the cell is a group of potassium atoms, a laser light source having a wavelength of about 770 nm, which is detuned from the central wavelength of the absorption line of potassium by 0.02 nm to 1 nm. The information as to the rotation angle of the polarization plane (or, the polarization direction) of the probe light according to this embodiment can be acquired by a photodiode array detecting the probe light having passed through the cell through a polarizing plate. Of course, as far as the information as to the rotation angle of the polarization plane can be acquired, other methods using other detecting units than the photodiode array can be used as required.

Specific Examples of Embodiment

In the following, specific examples of the optically pumped magnetometer capable of acquiring information as to strengths of magnetic fields in two different directions and the magnetic sensing method therefor will be described. First, an operation of the optically pumped magnetometer according to the present invention will be described according to the following three steps. That is, the description will be made with regard to (1) a step of optically pumped, (2) a step of causing a motion of spin polarization in the magnetic field, and (3) a step of reading the spin polarization with the probe light.

(1) In the step of optically pumped, an alkali metal gas encapsulated in the cell is illuminated with the circularly polarized pump light to align the directions of the electron spins of the atoms, thereby producing a spin polarization. The pump light has a wavelength that causes an optical transition from the ground level to the excited level, such as the $D_1$ transition of alkali metals. The circularly polarized pump light is absorbed by an electron in a particular spin state to cause a spin polarization of the alkali metal atom by the optically pumped effect. It can also be said that the circularly polarized pump light can cause a spin polarization because of the conservation of angular momentum. A photon of circularly polarized light having an angular momentum can excite an atom only if the pair of ground level and excited level of the atom allows acceptance of the angular momentum. For example, right-hand circularly polarized light is selectively absorbed by an electron only if the pair of ground level and excited level allows an increase of the angular momentum of the electron by a quantum number of 1. Once excited, atoms return to the ground level through spontaneous emission of randomly polarized light or collision with quencher gas atoms, for example. This process involves a mixture of atoms that return to the ground level by decreasing the angular momentum by a quantum number of 1 and atoms that return to the ground level while maintaining the angular momentum. As the random process of excitation and relaxation repeatedly occurs, the proportion of the atoms in the ground level that are not excited by the circularly polarized light increases. Eventually, the directions of the spins of the atoms forming the group of atoms are aligned in the direction of traveling of the circularly polarized light to produce a spin polarization. To increase the density of the alkali metal gas in the cell, the cell can be heated up to about 200° C. in the case where the alkali metal is potassium.

(2) In the step of causing a motion of a spin polarization in the magnetic field, a spin polarization S (which is a vector quantity) of an alkali metal atom is rotated by a torque in the magnetic field. As known, as an equation of motion of a spin under optically pumped in a magnetic field, an optical Bloch equation including the effects of pumping and relaxation can be used to describe the behavior of the spin polarization $S=(S_x, S_y, S_z)$. In the case where pump light traveling in the z direction is used, the optical Bloch equation for each component is expressed by the following formula (1).

$$\frac{dS_x}{dt} = \gamma(S_y \cdot B_z - S_z \cdot B_y) - \frac{1}{T_2}S_x$$

$$\frac{dS_y}{dt} = \gamma(S_z \cdot B_x - S_x \cdot B_z) - \frac{1}{T_2}S_y$$

$$\frac{dS_z}{dt} = \gamma(S_x \cdot B_y - S_y \cdot B_x) - \frac{1}{T_2}S_z + \frac{sR_{OP}}{2q}$$

Formula (1)

In this formula, $\gamma<0$ represents a gyromagnetic ratio, q represents a slowdown factor that depends on the spin polarization, and $B=(B_x, B_y, B_z)$ represents a magnetic field vector. $R_{OP}$ represents a pumping rate, and s represents a spin parameter that indicates the degree of circular polarization of the pump light, $s=-1$ corresponds to $\sigma^-$ circularly polarized light, and $s=1$ corresponds to $\sigma^+$ circularly polarized light. $T_2$ represents a transverse relaxation rate of the spin, which is related with a relaxation rate $R_{rel}$ of the spin according to the following formula.

$$T_2=(R_{OP}+R_{rel})^{-1}$$

In this example, a bias magnetic field $B_z$ having a strength of 1 nT ($1 \times 10^{-9}$ T) or higher is applied in the direction of the pump light to cause a resonance operation of the magnetometer. A precession of the spin polarization caused by optically pumped occurs about a rotation axis in the direction of the bias magnetic field at a Larmor frequency determined by the magnitude of the bias magnetic field. The Bloch equations describe not only the precession but also the motion of the spin polarization caused by the x component and the y component of the magnetic field.

(3) In the step of reading the spin polarization with the probe light, information as to the spin polarization in the magnetic field is read with the probe light. When the spin polarization has a component in the direction of propagation of the probe light, a rotation of the polarization plane occurs because of the magneto-optical effect, so that the magnitude of the spin polarization can be read. The wavelength of the probe light used is close to the resonance frequency of the alkali metal. The probe light is more detuned from the center of the resonance than the pump light to reduce absorption of the probe light, thereby reducing relaxation of the spin polarization by the probe light. When the x component $S_x$ of the spin polarization in the cell with the probe light in the x direction, the rotation angle of the polarization plane q is expressed by the following formula (2).

$$\phi_x = cr_e f n l S_x Re[L(v)] \quad \text{Formula (2)}$$

In this formula, c represents the speed of light in vacuum, $r_e$ represents the classical electron radius, f represents the oscillator strength of an absorption line ($D_1$, for example) used by the probe light, n represents the density of the alkali metal atoms, l represents the length of the optical path along which the probe light traverses the alkali metal gas, and $Re[L(v)]$ represents the real part of the Lorentz function that expresses the absorption line with respect to light at a frequency of v. The y component $S_y$ of the spin polarization in the cell can be read with the probe light in the y direction according to a similar formula.

The magneto-optical effect described above will be described below in further detail. The linearly polarized probe light can be described as a superposition of left-hand circularly polarized light and right-hand circularly polarized light. As described above with regard to the pump light, if a spin polarization occurs in a group of atoms, the left-hand circularly polarized light and the right-hand circularly polarized light are differently absorbed depending on the polarization. The difference in absorption coefficient means the imaginary part of the complex index of refraction, so that the real part of the index of refraction differs between the left-hand circularly polarized light and the right-hand circularly polarized light according to the Kramers-Kronig relations. The length of the optical path through the group of atoms differs between the left-hand circularly polarized light and the right-hand circularly polarized light, so that a rotation of the polarized plane of the liner polarized light, which is a superposition of the left-hand circularly polarized light and the right-hand circularly polarized light, is observed.

The optically pumped magnetometer according to this embodiment based on the principle described above will be described with reference to FIGS. 1 and 2. In FIG. 1, reference numeral 101 denotes a cell, reference numeral 102 denotes a pump light module (pump light optical system), reference numerals 103 and 104 denote probe light modules (a first probe light optical system and a second probe light optical system) that emit probe light in the x direction and the y direction, respectively. Reference numerals 105 and 106 denote polarimeter modules (a first detector and a second detector) disposed to face the probe light modules 103 and 104, respectively. The polarimeter modules measure the polarization planes of the probe light in the x direction and the y direction, respectively, and produce a differential signal that is determined by the rotation angle of the polarization plane.

Figure 2:
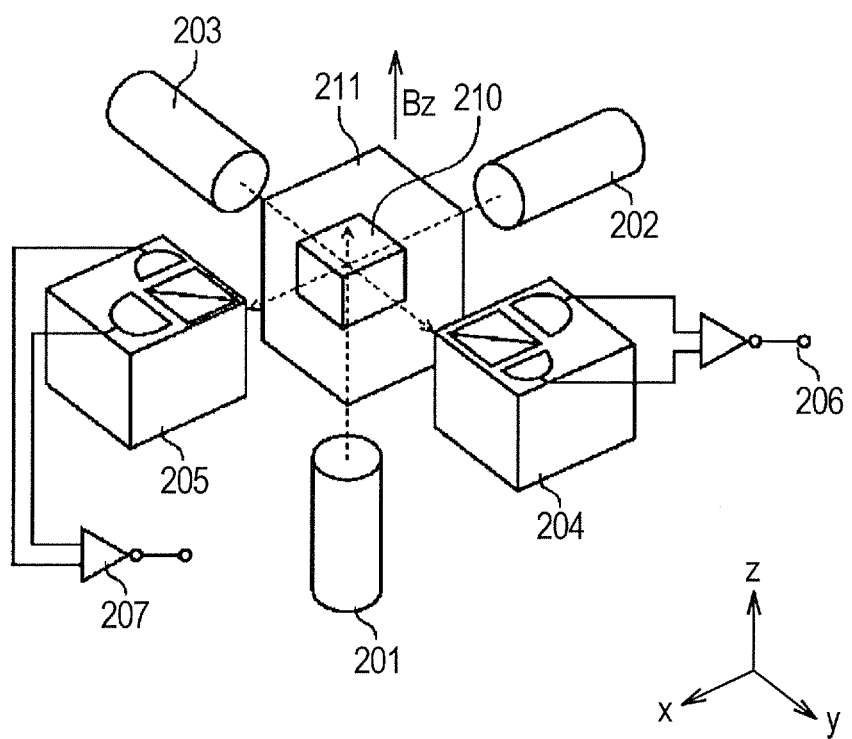
FIG. 2 is a diagram for illustrating a configuration of the optically pumped magnetometer according to Embodiment 1 of the present invention.

As shown in FIG. 2, an oven 211 is disposed on the optical paths of the pump light and the probe light, and an alkali metal cell 210 that encapsulates potassium, helium gas and nitrogen gas is held in the oven 211. The alkali metal cell 210 is heated to 180° C. in a typical example by a heater (not shown) or hot air passed through the oven. In FIG. 2, reference numeral 201 denotes a pump light module (pump light optical system), reference numerals 202 and 203 denote probe light modules (a first and a second probe light optical system), reference numerals 204 and 205 denote polarimeter modules (a first and a second detector), and reference numerals 206 and 207 denote sensor outputs at which a differential signal is output.

The pump light module 201 includes a semiconductor laser light source or a lens that collimates diverging light from an end of a fiber coupled to a laser light source at the other end into a parallel beam, a polarizer that transmits only linearly polarized light having a particular polarization plane, and a λ/4 wavelength plate that converts linearly polarized light into circularly polarized light. The wavelength of the laser light is controlled to be tuned to the $D_1$ absorption line of potassium.

A magnetic field applying unit (not shown) applies a static magnetic field $B_z$ in the z direction to the alkali cell. When the pump light from the pump light module 201 produces a spin polarization of the alkali metal atoms, a Larmor precession of the spin polarization occurs about a rotation axis in the x direction at an angular frequency $\omega_0 = \gamma B_z$ according to the formula (1). At the same time, a change of a magnetic field of the magnetic fields in the x direction and the y direction that oscillates with a frequency component on the order of the bandwidth centered on the angular frequency $\omega_0$ also produces a motion of the spin polarization according to the formula (1).

The probe light modules 202 and 203 have a configuration similar to that of the pump light module. That is, the probe light modules include a semiconductor laser light source or a lens that collimates diverging light from an end of a fiber coupled to a laser light source at the other end into a parallel beam, a polarizer that transmits only linearly polarized light having a particular polarization plane, and a λ/2 wavelength plate that rotates the polarization plane of linearly polarized light. The polarimeter modules 204 and 205 are balanced polarimeters that separate light into a p-wave and an s-wave with a polarized beam splitter, focus the respective waves of light, convert the respective waves of light into electrical signals with a photo detector, and differentially amplify the difference between the outputs. The orientation of the λ/2 wavelength plate of the probe light module 203 is rotated in advance to adjust the polarization plane of the linearly polarized light so that the output 206 is zero when the rotation angle of the polarization plane of the linearly polarized probe light from the probe light module 203 is zero. The rotation angle $\phi_y$ of the polarization plane is expressed by the following formula (3).

$$\phi_y = \frac{I_1 - I_2}{2(I_1 + I_2)} \quad \text{Formula (3)}$$

A similar adjustment of the probe light module 202 is made in advance so that the output 207 is zero when the rotation angle of the linearly polarized light from the probe light module 202 is zero, and the probe light module 202 operates in the same manner as the probe light module 203. The x component $S_x$ and the y component $S_y$ of the spin polarization in the cell can be obtained from the polarization rotation angle according to the formula (2) as discrete data sampled at a time $t_i$ expressed by the following formula (4).

$$S_x{}^i = S_x(t_i), S_y{}^i = S_y(t_i) \qquad \text{Formula (4)}$$

As a method of determining a time series signal from the response signals $S_x{}^i$ and $S_y{}^i$ of the magnetometer, a signal processing method for a time domain is used. Then, the first equation and the second equation of the optical Bloch equations (1) are solved with respect to $B_x(t)$ and $B_y(t)$.

Figure 10:
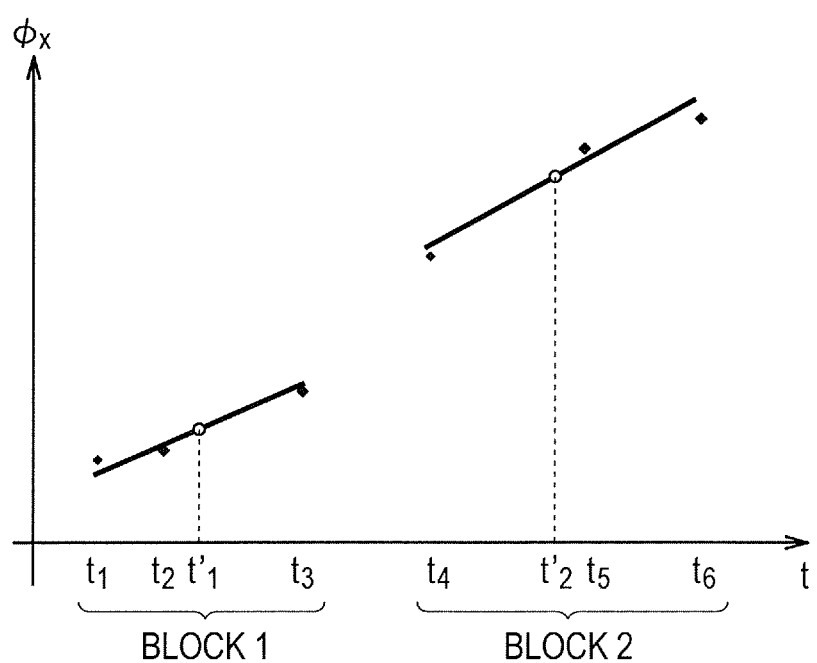
FIG. 10 is a graph for illustrating an example of calculation of a rotation angle and a differential coefficient of the rotation angle according to Embodiment 1 of the present invention.

According to this embodiment described above, a block of continuous N-data is produced from the sampled data on the rotation angle detected by the first detector and the rotation angle detected by the second detector. Then, a rotation angle representative of the block and a differential coefficient (e.g. time derivative) of the rotation angle can be determined according to a predetermined algorithm to provide a configuration that acquires information as to the strengths of magnetic fields in two different directions at the same time. The predetermined algorithm can be any one of the least-squares method and the weighted averaging method. An example of calculation of the rotation angle and the differential coefficient of the rotation angle will be described with reference to FIG. 10. In the graph shown in FIG. 10, the rotation angles q in the x direction measured at times $t_1$, $t_2$, $t_3$, $t_4$, $t_5$ and $t_6$ are shown by black dots. The three pieces of data as to the rotation angles at the times $t_1$, $t_2$ and $t_3$ form a block 1, and the three pieces of data as to the rotation angles at the times $t_4$, $t_5$ and $t_6$ form a block 2. Then, a differential coefficient for the data as to the rotation angles at $t_1$, $t_2$ and $t_3$ is determined according to the least-squares method, and the determined differential coefficient is regarded as the differential coefficient of the rotation angle representative of the block 1. An exemplary method of determining the differential coefficient according to the least-squares method is to determine the coefficient that minimizes the sum of squares of residuals in approximation of the data as to the measured rotation angles to a linear function. The least-squares method is not limited to the implementation described above, and a logarithmic function or other functions may be used for approximation. The rotation angle representative of the block 1 is the rotation angle (shown by a white dot in the graph) at a time ($t'_1$) between the times $t_1$ and $t_3$, for example. The rotation angle representative of a block may be the rotation angle at the earliest time in the block or the rotation angle at the latest time in the block. Similarly, the rotation angle representative of the block 2 and the differential coefficient of the rotation angle are determined. Although not shown, the differential coefficient and the rotation angle for other blocks can be determined in the same manner. Although only $\phi_x$ has been described above, the description holds true for $\phi_y$. A case where the rotation angle representative of each block and the differential coefficient of the rotation angle are determined according to the weighted averaging method will be described later in the section Specific Examples of Embodiment. The number of pieces of data forming a block is not particularly limited as far as the number is equal to or more than 2.

Embodiment 2

An optically pumped magnetometer according to Embodiment 2 of the present invention will be described. Description of items common to Embodiments 1 and 2 will be omitted, and differences between Embodiments 1 and 2 will be described. The optically pumped magnetometer according to this embodiment includes the following components. That is, an optically pumped magnetometer calculating unit according to this embodiment includes a first calculating unit that calculates the rotation angle of the polarization plane detected by the first detector, the frequency spectrum of the rotation angle of the polarization plane detected by the first detector, and the frequency spectrum of the rotation angle of the polarization plane detected by the second detector. The optically pumped magnetometer calculating unit further includes a second calculating unit that calculates information as to the strengths of the magnetic fields in the two directions from the frequency spectrum of the rotation angle of the polarization plane detected by the first detector, the frequency spectrum of the rotation angle of the polarization plane detected by the second detector and an eigen solution of the Bloch equation on the assumption that the spin polarization in the direction of the static magnetic field is constant.

Although this embodiment uses the same optical system according to Embodiment 1 described above, this embodiment differs from Embodiment 1 in that the optically pumped magnetometer calculating unit has the first calculating unit and the second calculating unit. The first calculating unit calculates the frequency spectrum of the rotation angle of the polarization plane detected by the first detector and the frequency spectrum of the rotation angle of the polarization plane detected by the second detector from the rotation angle of the polarization plane detected by the first detector and the rotation angle of the polarization plane detected by the second detector. The second calculating unit uses the eigen solution of the Bloch equation on the assumption that the spin polarization in the direction of the static magnetic field is constant. The information as to the strengths of the magnetic fields in the two directions is calculated by substituting the frequency spectrum of the rotation angle of the polarization plane detected by the first detector and the frequency spectrum of the rotation angle of the polarization plane detected by the second detector into the eigen solution of the Bloch equation. The first calculating unit and the second calculating unit enable the optically pumped magnetometer according to this embodiment to calculate the strengths of the magnetic fields in the two directions.

Specific Examples of Embodiment

In the following, specific examples of the optically pumped magnetometer capable of acquiring information as to the strengths of magnetic fields in two different directions and the magnetic sensing method according to one of the embodiments described above (embodiment 1) will be described. The approximation described below is introduced to the first and second equations in the Bloch equations (1). A small change in $S_z$ is ignored, and the z component $S_z$ is regarded as a constant value. The transverse relaxation rate $T_2$ is regarded as a constant and separately determined in advance from the last measurement, for example. Using the discrete data $S_x{}^i$ and $S_y{}^i$ obtained by measurement, the differential term is replaced with a difference expressed using $S_x{}^i$, $S_x{}^{i+1}$, $S_y{}^i$ and $S_y{}^{i+1}$.

$$\frac{d}{dt}S_r\left(t_i + \frac{\Delta t}{2}\right) \approx \frac{S_r^{i+1} - S_r^i}{\Delta t} \quad (r = x, y) \qquad \text{Formula (5)}$$

As for $S_x$ and $S_y$, the value S at a time $t_i + [(t_{i+1} - t_i)/2]$ is interpolated according to the following formula (6) using the values $S_x{}^i$, $S_x{}^{i+1}$, $S_y{}^i$ and $S_y{}^{i+1}$.

$$S_r\left(t_i + \frac{\Delta t}{2}\right) \approx \frac{S_r^{i+1} + S_r^i}{2} \equiv S_r^{i+\frac{1}{2}} \quad (r = x, y) \qquad \text{Formula (6)}$$

Using these values, magnetic field signals $B_x^{i+1/2}$ and $B_y^{i+1/2}$ at the time $t_i+[(t_{i+1}-t_i)/2]$ can be separated according to the following formula (7) with a small effect in the x direction and the y direction.

$$B_x^{i+\frac{1}{2}} = \frac{1}{\gamma S_z}\left(\frac{S_y^{i+1}-S_y^i}{\Delta t} + \gamma B_z S_x^{i+\frac{1}{2}} + \frac{S_y^{i+\frac{1}{2}}}{T_2}\right) \quad \text{Formula (7)}$$

$$B_y^{i+\frac{1}{2}} = -\frac{1}{\gamma S_z}\left(\frac{S_x^{i+1}-S_x^i}{\Delta t} + \gamma B_z S_y^{i+\frac{1}{2}} + \frac{S_x^{i+\frac{1}{2}}}{T_2}\right)$$

Figure 3A:
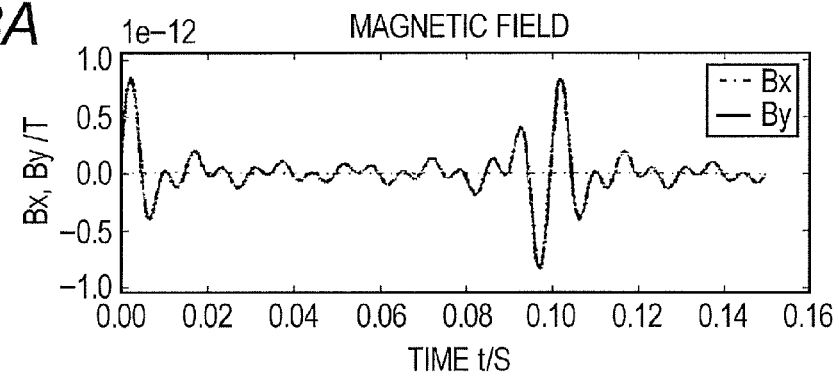
FIGS. 3A, 3B and 3C include graphs for illustrating a simulation result of a magnetometer operation and a signal processing according to Embodiment 2 of the present invention.
Figure 3B:
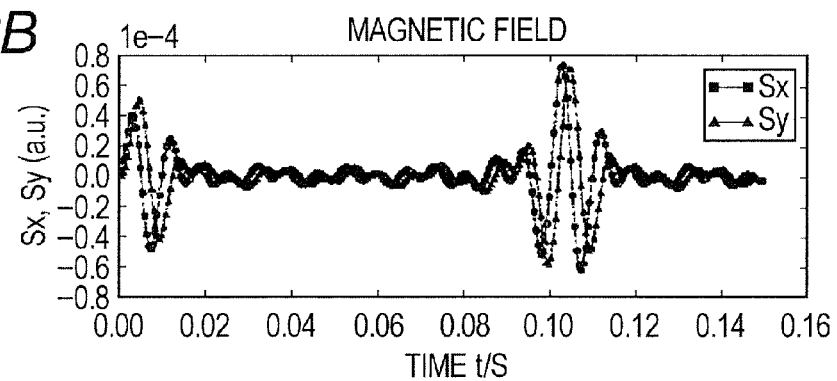
Figure 3C:
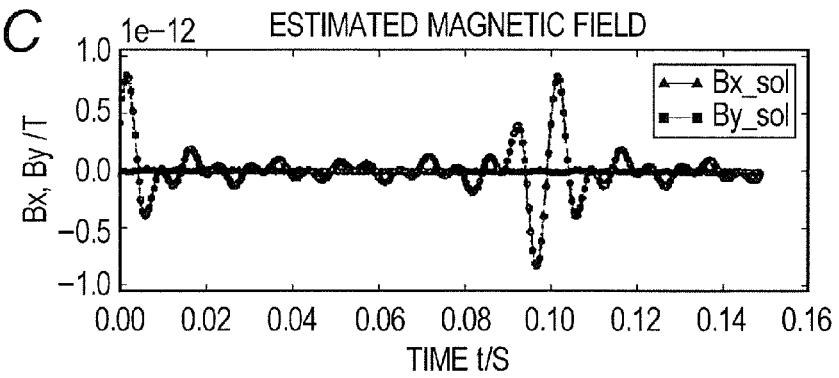

FIGS. 3A to 3C show a simulation of the signal processing. FIG. 3A shows the magnetic field $B_y$ as a superposition of sine waves having frequencies increasing from 80 Hz to 120 Hz in steps of 10 Hz. In this simulation, it is assumed that $B_x$ is zero. The behavior of the spin polarization ($S_x$, $S_y$, $S_z$) of the alkali metal atoms in such a magnetic field according to the Bloch equations (1) is calculated by numerical integration of the equations (1), and FIG. 3B shows the calculation results for $S_x$ and $S_y$. Because of the effects of the resonance characteristics of the spin polarization according to the Bloch equations under the conditions that $B_z=14.3$ nT, q=1, $T_2=5$ ms and $R_{OP}=400$ s$^{-1}$ (a bias magnetic field $B_z$ that resonates at 100 Hz is selected) and the relaxation time, the waveform of the polarization has different characteristics than the changes of the magnetic field, and both the x component and the y component occur. In this simulation, it is assumed that the sampling interval of the spin polarization is 0.5 milliseconds. FIG. 3C shows the magnetic fields $B_x$ and $B_y$ calculated according to the formula (7) as described above. FIG. 3C also shows the waveform of $B_y$ shown in FIG. 3A superposed on the calculated magnetic fields $B_x$ and $B_y$, and suggests that the waveform of $B_y$ is satisfactorily reproduced. $B_x$ is substantially zero, suggesting the effectiveness of the signal recovery according to the formula (7). On the scale of this plot, a slight change in $B_x$ is observed when the magnetic field $B_y$ is high.

Figure 4A:
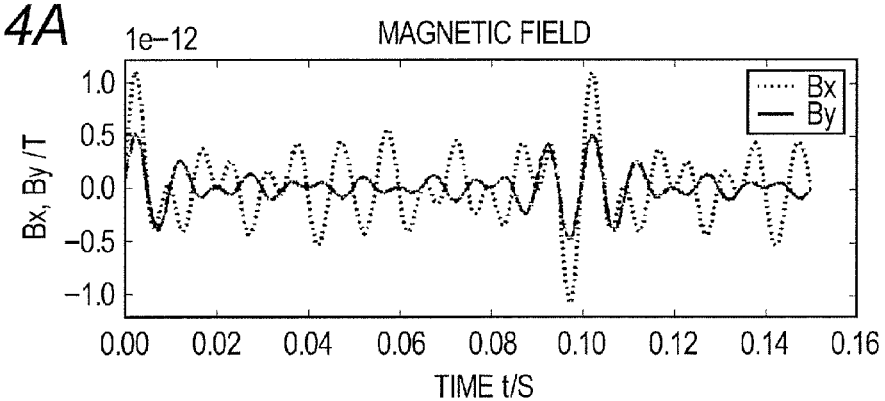
FIGS. 4A, 4B and 4C include graphs for illustrating a second simulation result of the magnetometer operation and the signal processing according to Embodiment 2 of the present invention.
Figure 4B:
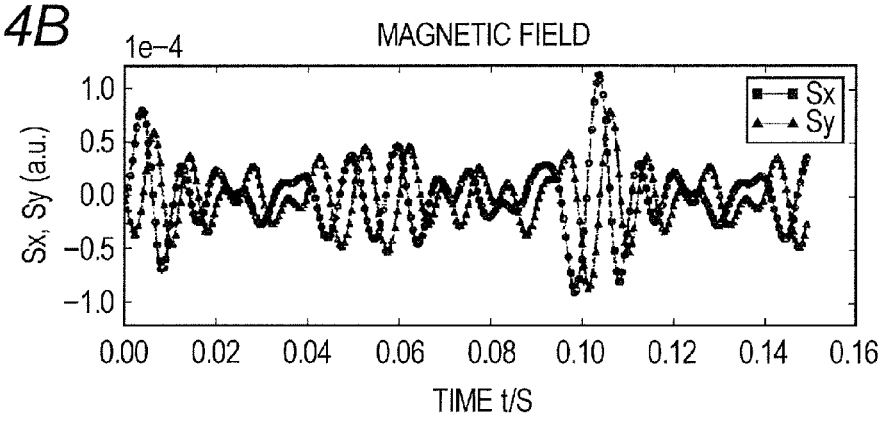
Figure 4C:
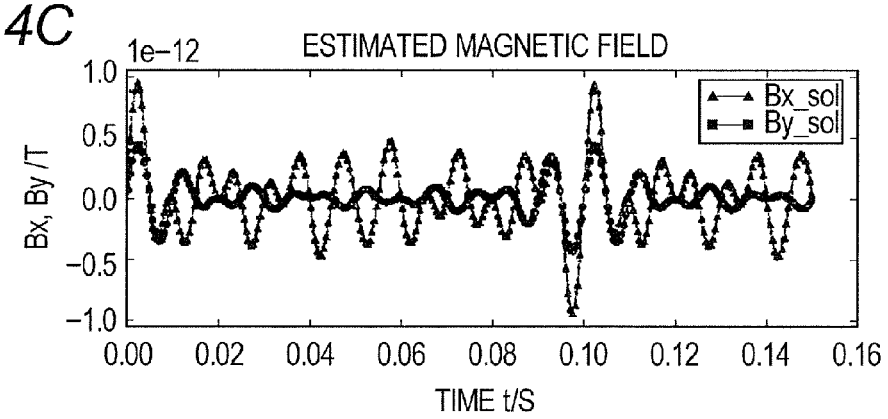

FIGS. 4A to 4C show a simulation in which both $B_x$ and $B_y$ change with time. In the magnetic fields shown in FIG. 4A, the spin polarization shown in FIG. 4B occurs. The magnetic fields Bx and By shown in FIG. 4C are obtained by reproducing the changes of the magnetic fields from the signals shown in FIG. 4C according to the formula (7). In the case where it is obvious from other knowledge that $B_x$ is zero as in the case shown in FIGS. 3A to 3C, even a sensor with one beam of probe light can reproduce the magnetic field signals by considering the complex transfer function of the resonance. In a situation where it cannot be assured that $B_x$ is zero as in the case shown in FIGS. 4A to 4C, considering the complex transfer function is not enough to separate and uniquely determine $B_x$ and $B_y$. $B_x$ and $B_y$ can only be separated from each other in the method according to the present invention.

In the example of signal processing described above, the values $S_x^i$ and $S_y^i$ and the difference therebetween are determined using only two adjacent points at the times $t_i$ and $t_{i+1}$ of the time-series sampled data. However, the number of pieces of data used for this signal processing is not limited to two, and the signal processing may include a processing of extracting the moving average and the average change rate from three or more points. For example, the moving average and the average changes $\Delta S_x^i$ and $\Delta S_y^i$ in the section are determined from four pieces of data at points $t_i$, $t_{i+1}$, $t_{i+2}$ and $t_{i+3}$. Then, in the following step, the average changes $\Delta S_x^{i+1}$ and $\Delta S_y^{i+1}$ are determined from data at four points $t_{i+1}$, $t_{i+2}$, $t_{i+3}$ and $t_{i+4}$. In this way, the effect of random noise can be reduced. If the timings of sampling of $S_x^i$ and $S_y^i$ disagree, data interpolation can be performed to determine a specific difference method that expresses $S_x^i$ and $S_y^i$ at the same time and the differential thereof, for example. Bx and By can be separated by solving the Bloch equations in the same manner using these values.

Alternatively, the methods of data acquisition and signal processing described below are possible. First, the timing of data acquisition is defined as follows. The sampling time interval $\Delta t$ is defined, the timing of acquisition of the spin polarization in the x direction is defined as $t_i=\Delta t \times i$, and the acquired spin polarization in the x direction is expressed as $S_x^i$. The timing of acquisition of the spin polarization in the y direction is defined as $t_{i+1/2}=\Delta t \times (i+1/2)$, and the acquired spin polarization in the y direction is expressed as $S_y^{i+i/2}$. Then, the x component $B_x^i$ of the magnetic field at the time $t_i$ and the y component $B_y^{i+1/2}$ of the magnetic field at the time $t_{i+1/2}$ can be determined according to the following formulas (8) and (9).

$$B_x^i = \frac{1}{\gamma S_z}\left(\frac{S_y^{i+1/2}-S_y^{i-1/2}}{\Delta t} + \gamma B_z S_x^i + \frac{S_y^{i+1/2}+S_y^{i-1/2}}{2T_2}\right) \quad \text{Formula (8)}$$

$$B_y^{i+\frac{1}{2}} = -\frac{1}{\gamma S_z}\left(\frac{S_x^{i+1}-S_x^i}{\Delta t} - \gamma B_z S_y^{i+\frac{1}{2}} + \frac{S_x^i+S_x^{i+1}}{2T_2}\right) \quad \text{Formula (9)}$$

The first term, the second term and the third term of the right side of the formula (8) represent the differential and the values $S_x$ and $S_y$ at the same time, respectively. The same holds true for the formula (9). However, this signal processing method is characterized in that the formulas (8) and (9) differ in time by $\Delta t/2$.

Next, a signal processing in a frequency domain (which corresponds to Embodiment 2) will be described. Eigen solutions of the first equation and the second equation of the Bloch equations (1) in a magnetic field at an angular frequency $\omega$ are determined. The eigen solutions are expressed as complex quantities as shown by the following formula (10).

$$\begin{bmatrix} S_{x0}e^{i\omega t} \\ S_{y0}e^{i\omega t} \end{bmatrix} = \frac{\gamma S_z}{2}\begin{bmatrix} i(-h_1+h_2) & h_1+h_2 \\ -h_1-h_2 & i(-h_1+h_2) \end{bmatrix}\begin{bmatrix} B_{x0}e^{i\omega t} \\ B_{y0}e^{i\omega t} \end{bmatrix} \quad \text{Formula (10)}$$

In this formula, $B_{x0}$ and $B_{y0}$ represent complex amplitudes of the magnetic fields in the x direction and the y direction, respectively, and $S_{x0}$ and $S_{y0}$ represent complex amplitudes of the spin polarization in the x direction and the y direction, respectively. As with the typical expression using complex numbers, the actually observed quantities are the real parts of $S_{x0}e^{i\omega t}$ and $S_{y0}e^{i\omega t}$. Furthermore, $h_1$ and $h_2$ are terms that express a resonance and are specifically expressed by the following formulas (11) using a Larmor angular frequency $\omega_0=-\gamma B_z$, which is determined by the bias magnetic field.

$$h_1 = \frac{1}{1/T_2+i(\omega-\omega_0)}. \quad \text{Formula (11)}$$

$$h_2 = \frac{1}{1/T_2+i(\omega+\omega_0)}.$$

The common transfer term $$e^{i\omega t}$$

is removed from both sides of the formula (10), and the formula (10) is solved with respect to $B_{x0}$ and $B_{y0}$, resulting in the following formula (12).

$$\begin{bmatrix} B_{x0} \\ B_{y0} \end{bmatrix} = \frac{2}{\gamma S_z} \frac{1}{4h_1 h_2} \begin{bmatrix} i(-h_1 + h_2) & -h_1 - h_2 \\ h_1 + h_2 & i(-h_1 + h_2) \end{bmatrix} \begin{bmatrix} S_{x0} \\ S_{y0} \end{bmatrix} \quad \text{Formula (12)}$$

A small change in $S_z$ is ignored, and the value $S_z$ is regarded as a constant value. In addition, the transverse relaxation time $T_2$ is regarded as a constant and separately determined in advance from the last measurement, for example. Although the formula (10) is expressed in a form of a rotating magnetic field, the formula (10) corresponds to complex conjugate terms of rotating magnetic fields in a first rotational direction and a second rotational direction resulting from separation of an oscillating magnetic field at an angular frequency ω into rotating magnetic fields that rotate at the angular frequency ω in two rotational directions. $h_1$ in the formulas (11) represents a contribution of the magnetic field that rotates in the same direction as the Larmor motion about the static magnetic field $B_z$, and $h_2$ in the formulas (11) represents a contribution of the magnetic field that rotates in the opposite direction to the Larmor motion about the static magnetic field. Returning to the formula (10), the first line is written as follows.

$$S_{x0} = \gamma S_z [i(-h_1 + h_2) B_{x0} + (h_1 + h_2) B_{y0}]$$

The second term in the parentheses shows that, as for the contribution of the magnetic field in the y direction to the spin polarization in the x direction, the contribution of the magnetic field that rotates in the same direction as the Larmor motion and the contribution of the magnetic field that rotates in the opposite direction are related to reinforce each other. On the other hand, the first term in the parentheses shows that, as for the contribution of the magnetic field in the x direction to the spin polarization in the x direction, the contribution of the magnetic field that rotates in the same direction as the Larmor motion and the contribution of the magnetic field that rotates in the opposite direction are related to cancel each other (the imaginary unit i corresponds to a phase change).

The same relationships are also observed in the second line of the formula (10). Thus, the contributions of the magnetic fields $B_{x0}$ and $B_{y0}$ to $S_{x0}$ and $S_{y0}$ are independent of each other, and the formula (12) can be obtained by solving the formula (10). Thus, it can be seen that the complex magnetic field amplitudes $B_{x0}$ and $B_{y0}$ that oscillate at the angular frequency ω can be calculated from the complex spin polarization amplitudes $S_{x0}$ and $S_{y0}$ that oscillate at the angular frequency ω. It is also seen that when $1/T_2 \ll \omega_0$, $h_2$ is so small compared with $h_1$ that $h_2$ is negligible, and the effectiveness of the calculation of the formula (12) decreases. This means that the effectiveness decreases in a situation where the bias magnetic field $B_z$ is high, and the angular frequency $\omega_0$ chosen is much larger than the resonance width of the alkali metal.

To obtain the complex spin polarization amplitudes $S_{x0}(\omega)$ and $S_{y0}(\omega)$ by measurement, the Fourier transform of the measured discrete data $S_x^i$ and $S_y^i$ is performed. The magnetic field frequency spectra $B_x(\omega)$ and $B_y(\omega)$ can be derived by applying the formula (12) for each angular frequency. Magnetic field signals $B_x(t)$ and $B_y(t)$ in the time domain are determined by performing the inverse Fourier transform of $B_x(\omega)$ and $B_y(\omega)$ for all the angular frequencies obtained by the Fourier transform.

Figure 5A:
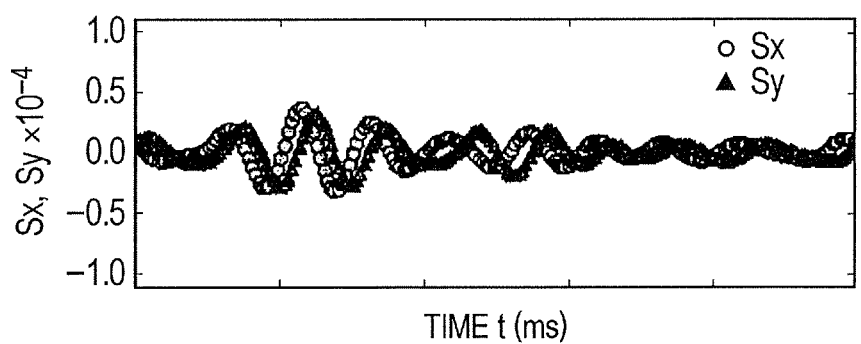
FIGS. 5A and 5B include graphs for illustrating a third simulation result of the magnetometer operation and the signal processing according to Embodiment 2 of the present invention.
Figure 5B:
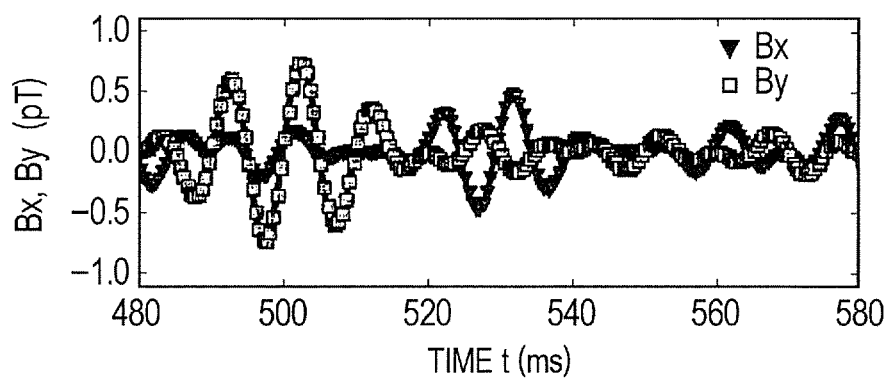

FIGS. 5A and 5B show a simulation of the signal processing. FIG. 5A shows part of the spin polarization components $S_x$ and $S_y$ (corresponding to one cycle period) used for calculation. These values show a behavior of the spin polarization ($S_x$, $S_y$, $S_z$) of the alkali metal atoms in magnetic fields $B_x(t)$ and $B_y(t)$ shown by the solid line behind the dot sequence in FIG. 5B, which are superpositions of sine waves, calculated by numerical integration according to the Bloch equations (1). The magnetic field $B_x$ is a superposition of sine waves having an amplitude of 0.1 pT and frequencies of 70 Hz, 90 Hz, 100 Hz, 110 Hz and 130 Hz. The magnetic field $B_x$ is formed by superposing the sine waves in such a manner that the phases of all the sine waves are zero at a time t=29.41 ms. The magnetic field $B_y$ is a superposition of sine waves having an amplitude of 0.15 pT and frequencies of 80 Hz, 90 Hz, 100 Hz, 110 Hz and 120 Hz. The magnetic field $B_y$ is formed by superposing the sine waves in such a manner that the phases of all the sine waves are zero at a time t=0. Other parameters are the same as those used in the simulations shown in FIGS. 3A to 3C and FIGS. 4A to 4C: $B_z$=14.3 nT, q=1, $T_2$=5 ms and $R_{OP}$=400 $s^{-1}$. Similarly, the sampling interval of the spin polarization is 0.5 milliseconds. In FIG. 5B, $B_x$ and $B_y$, which are determined by performing the Fourier transform of $S_x$ and $S_y$ in FIG. 5A, deriving $B_x(\omega)$ and $B_y(\omega)$ according to the formula (10) and performing the inverse Fourier transform of $B_x(\omega)$ and $B_y(\omega)$, are shown by triangles and squares, respectively. The solid line in FIG. 5B is not dots linked to each other but a magnetic field signal that is a starting point of the calculation, and the dots determined by the inverse Fourier transform satisfactorily agree with the curve. As described above, with this sensor, the temporal waveforms of $B_x$ and $B_y$ can also be reproduced according to the signal processing method in the frequency domain.

(Program)

An exemplary program according to an embodiment of the present invention is an information acquisition program for acquiring information as to strengths of magnetic fields in two different directions according to the magnetic sensing method according to one of Embodiments 1 and 2 described above. That is, the program is an information acquisition program for acquiring information as to strengths of magnetic fields in two different directions that makes a computer perform a step of emitting pump light having a circularly polarized component, first probe light having a liner polarized component and second probe light having a linearly polarized component to a cell containing a group of alkali metal atoms so as to form a crossing region, a step of applying, by a magnetic field applying unit, a static magnetic field in a direction of the pump light incident on the crossing region during the emission of the pump light, the first probe light and the second probe light, and a step of calculating the information as to strengths of magnetic fields in two different directions perpendicular to the direction of the static magnetic field applied by the magnetic field applying unit in the cell from the rotation angle of the plane of polarization of the first probe light and the rotation angle of the plane of polarization of the second probe light during passage through the cell. The approximation used in the step of calculating the information as to the strengths of the magnetic fields has already been described with regard to Embodiments 1 and 2 and therefore will not be further described. The program according to this embodiment of the present invention is computer-readable and may be recorded on a recording medium or downloaded from the Internet.

(Recording Medium)

An exemplary recording medium according to an embodiment of the present invention is a computer-readable recording medium on which an information acquisition program for acquiring information as to strengths of magnetic fields in two different directions is recorded. The recording medium may be a CD (including a CDR and a CDRW), a DVD (including a DVDR and DVDRW), a flash memory, a hard disk, a magnetic tape or a floppy (registered trademark) disk.

EXAMPLES

In the following, examples of the present invention will be described.

Example 1

Figure 6:
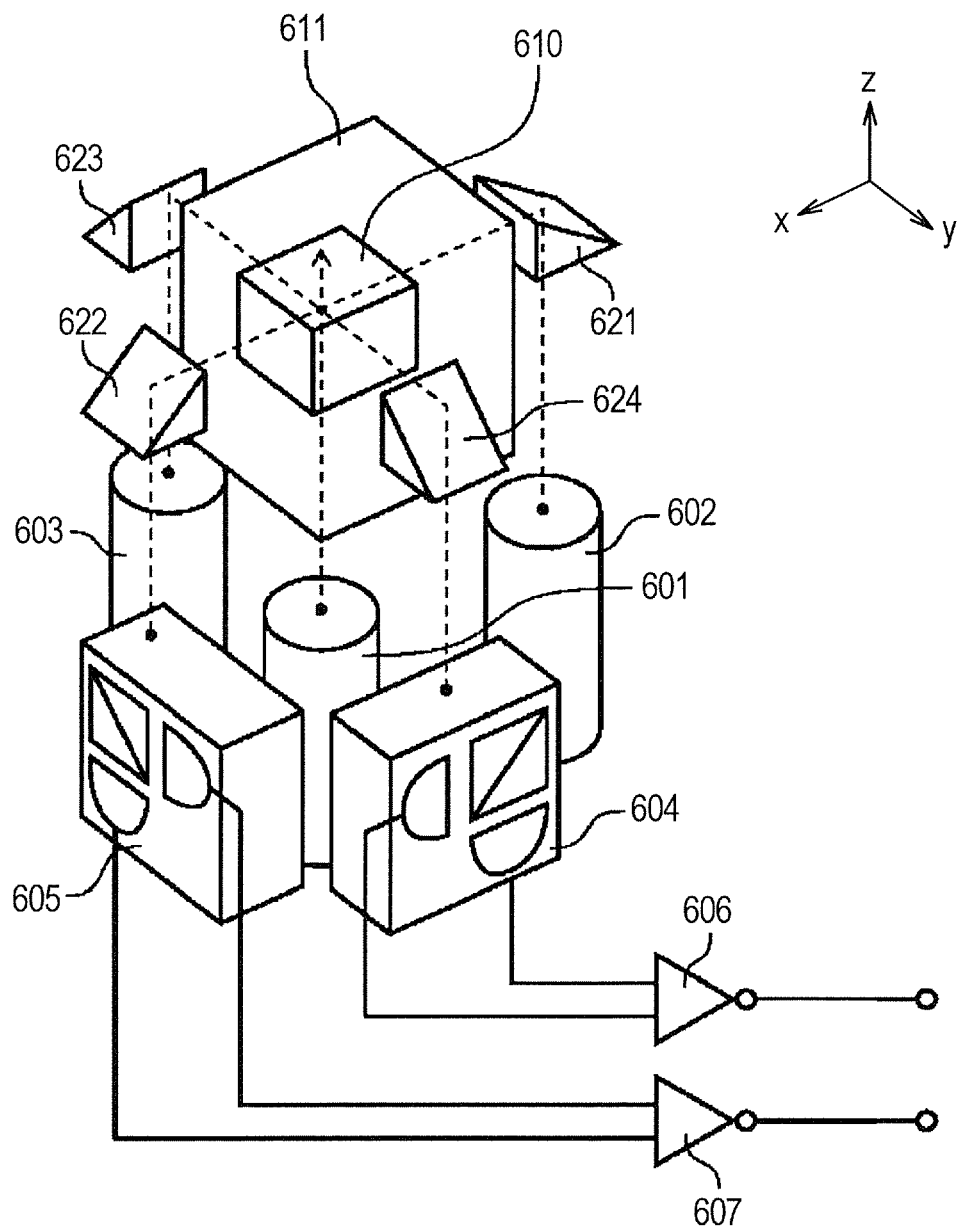
FIG. 6 is a diagram for illustrating an exemplary configuration of a sensor according to Example 1 of the present invention.

As Example 1, an exemplary configuration of a sensor in which the optical path of the probe light passing through the cell to which the present invention is applied can be folded back by a mirror disposed in the optical path will be described. The configuration according to this example allows reduction of the footprint of the sensor on the sample surface. In FIG. 6, reference numerals 621 to 624 denote prism mirrors. Light entering the prism through an incident surface with a low-reflection coating is totally reflected by the interface between the glass of the prism and air, so that the direction of travelling of the light is folded back. The other components and the signal reproducing operation are the same as those in Embodiment 1. That is, in FIG. 6, reference numeral 601 denotes a pump light module, reference numerals 602 and 603 denote probe light modules, reference numerals 604 and 605 denote polarimeter modules, and reference numerals 606 and 607 denote sensor outputs at which a differential signal is output. Reference numeral 610 denotes an alkali cell, and reference numeral 611 denotes an oven. According to this example, the volume occupied by the sensor that involves passing probe light in different directions can be relatively reduced, so that a small sensor module can be provided.

Example 2

Figure 7:
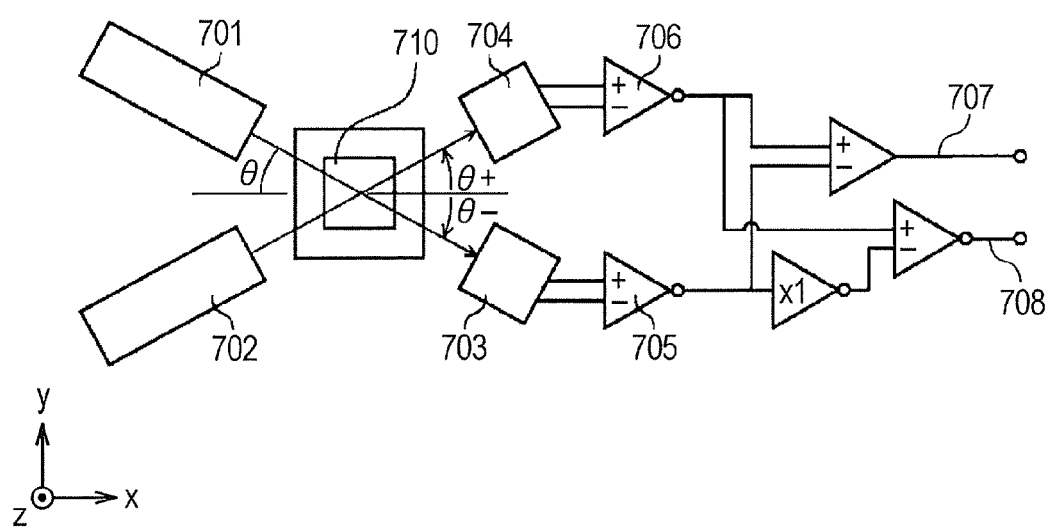
FIG. 7 is a diagram for illustrating an exemplary configuration that reproduce a two-dimensional magnetic field vector according to Example 2 of the present invention.

In Example 2, there will be described an exemplary configuration for reproducing a two-dimensional magnetic field vector by applying the method according to the present invention in the case where the two beams of probe light passing through the cell are not perpendicular to each other. FIG. 7 is a diagram showing an optically pumped magnetometer according to this example viewed in the z direction, which is the direction of propagation of the pump light. In FIG. 7, reference numerals 701 and 702 denote probe light modules that emit probe light at an angle of $+\theta$ and $-\theta$ with respect to the x direction, respectively. Reference numerals 703 and 704 denote polarimeter modules that are disposed to face the probe light modules 701 and 702, respectively, measure the polarization plane of the probe light, and produce a differential signal that is determined by the rotation angle of the polarization plane at sensor outputs 705 and 706, respectively. An output 707 is a difference signal between the two sensor outputs 705 and 706, and an output 708, to which the output of the sensor output 705 is coupled via an inverting amplifier with a gain of 1, is a sum signal of the two sensor outputs 705 and 706. The two beams of probe light cross each other in an alkali cell 710 that encapsulates potassium, helium gas and nitrogen gas. Pump light, not shown, is emitted to the alkali cell in the direction perpendicular to the sheet of the drawing. The output 706 is a quantity proportional to a component $S_{+}$ in a $\theta_{+}$ direction of the spin polarization in the x-y plane in the alkali cell 710. The output 707 is a quantity proportional to a component $S_{+}$ in a $\theta_{-}$ direction of the spin polarization in the x-y plane in the alkali cell 710. The x-directional component $S_x$ and the y-directional component $S_y$ of the spin polarization are associated with each other according to the following relations (13).

$$S_x = (S\theta_+ + S\theta_-)/(2\cos\theta)$$

$$S_y = (S\theta_+ - S\theta_-)/(2\sin\theta) \quad \text{Formula (13)}$$

Thus, $S_x$ and $S_y$ can be determined by correcting the outputs 707 and 708 in terms of the contributions of $\sin\theta$ and $\cos\theta$ according to the formulas (2) and (13). $B_x$ and $B_y$ can be derived from $S_x$ and $S_y$ in the same process as in Embodiment 1. With such an arrangement, the smaller $\theta$, the greater the response to $S_x$ is, and the smaller the response to $S_y$ is. To reduce the anisotropy of the sensitivity, $\theta$ is preferably set at 45° so that the coefficients in the two formulas (6) are equal to each other.

Reference Example 1

As a reference example, FIGS. 8A to 8D show a simulation result in the case where the magnetic field signal is reproduced by considering only the transfer function of $B_y$ with respect to $S_x$ of the spin polarization.

(Simulation Conditions)

Figure 8A:
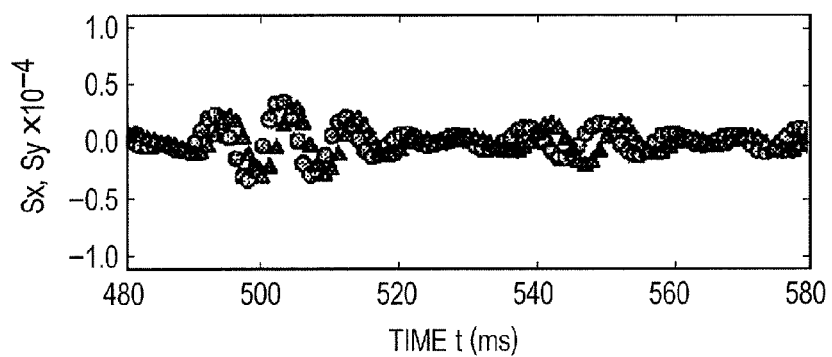
FIGS. 8A, 8B, 8C and 8D include graphs for illustrating a simulation result in the case where reproduction of a magnetic field signal by considering only a transfer function of $B_y$ with respect to $S_x$ of a spin polarization is attempted according to Reference example 1.
Figure 8B:
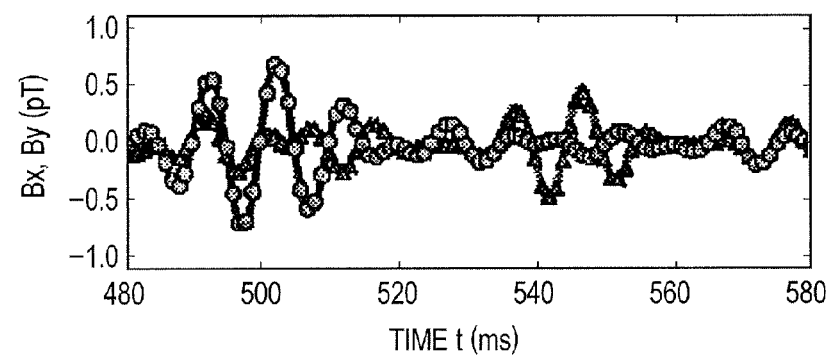
Figure 8C:
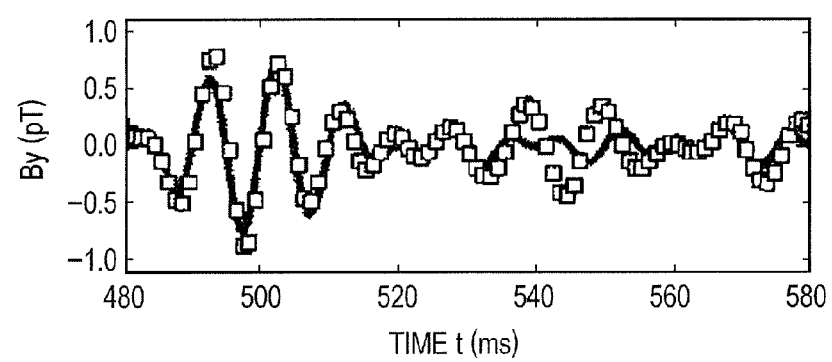

The magnetic field $B_x$ is a superposition of sine waves having an amplitude of 0.1 pT and frequencies of 70 Hz, 90 Hz, 100 Hz, 110 Hz and 130 Hz. The magnetic field $B_x$ is formed by superposing the sine waves in such a manner that the phases of all the sine waves are zero at a time t=35.29 ms. The magnetic field $B_y$ is a superposition of sine waves having an amplitude of 0.15 pT and frequencies of 80 Hz, 90 Hz, 100 Hz, 110 Hz and 120 Hz. The magnetic field $B_y$ is formed by superposing the sine waves in such a manner that the phases of all the sine waves are zero at a time t=0. Other parameters are the same as those used in the simulations shown in FIGS. 3A to 3C and FIGS. 4A to 4C: $B_z$=14.3 nT, q=1, $T_2$=5 ms and $R_{OP}$=400 s$^{-1}$. Similarly, the sampling interval of the spin polarization is 0.5 milliseconds. (Although the conditions are mostly the same as those of the simulation shown in FIGS. 5A and 5B, the time at which the phases of all the sine waves forming $B_x$ are zero is a different value, 35.29 ms.) FIG. 8A shows temporal changes of the components $S_x$ (circles) and $S_y$ (triangles) of the spin polarization, and FIG. 8B shows the solutions $B_x$ (triangles) and $B_y$ (circles) in the time domain. FIG. 8C shows $B_y$ obtained in the case where only the transfer function of $B_y$ with respect to $S_x$ of the spin polarization is considered. The transfer function method in this reference example is to consider only the following formula (14) as a transfer function $T(\omega)$ between the spectrum $S_x(\omega)$ of the component $S_x$ of the spin polarization in the frequency domain and the spectrum $B_y(\omega)$ of the y component $B_y$ of the magnetic field in the frequency domain.

$$\tilde{T}(\omega) = \frac{\gamma S_z^0}{2}\left[\frac{1}{\Delta\omega - i(\omega - \omega_0)} + \frac{1}{\Delta\omega - i(\omega + \omega_0)}\right] \quad \text{Formula (14)}$$

Figure 8D:
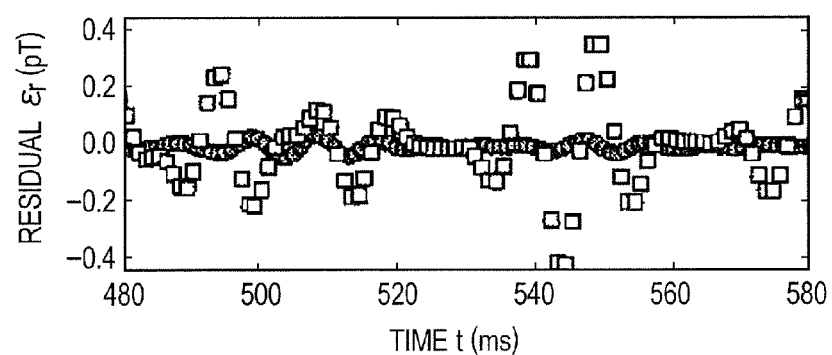

A relation holds: $S_x(\omega) = T(\omega)B_y(\omega)$. To obtain the complex spin polarization amplitude $S_{x0}(\omega)$ by measurement, the Fourier transform of the measured discrete data $S_x^i$ is performed. The frequency spectrum $B_y(\omega)$ of the magnetic field can be derived by applying the formula (14) for each angular frequency. The magnetic field signal $B_y(t)$ in the time domain obtained by performing the inverse Fourier transform of $B_y(\omega)$ for all the angular frequencies obtained by the Fourier transform is shown. FIG. 8D shows plots of the difference between the value $B_y$ and the magnetic field signal that is the starting point of the calculation for two different methods (circles show the case of the time-domain solution, and rectangles show the case of the transfer function method). FIGS. 8C and 8D show that, according to the transfer function method, the error of $B_y$ is large when the magnetic field $B_x$ is high.

Reference Example 2

Next, to compare the signal distortion between the one-axis optically pumped magnetometer and the two-axis pumping magnetometer, a quantity referred to as a crosstalk is defined as described below. Of the magnetic fields $B^i_{1B,y}(t)$ finally output from the optically pumped magnetometer, a magnetic field caused by $B_x(t)$ will be referred to as a crosstalk to the magnetic field $B_y$ in the y direction. Similarly, of the magnetic fields $B^i_{1B,x}(t)$ finally output from the optically pumped magnetometer, a magnetic field caused by $B_y(t)$ will be referred to as a crosstalk to the magnetic field $B_x$ in the x direction. These quantities can be determined by simulation. In the following, computational estimation of the crosstalk to $B_y$ will be described. The crosstalk to $B_x$ can also be evaluated in the same manner by interchanging x and y. First, consider a situation where the magnetic field in the x direction forming the magnetic field vector in the x-y plane is zero. In other words, consider a magnetic field: $[B_x(t), B_y(t)]^T = [0, B_y(t)]^T$. As a response of the spin polarization, a time-varying spin polarization vector expressed by the following formula (15) is obtained.

$$[S^{sim}_x, S^{sim}_y]^T = S^i[0, B_y(t)] = [S^i_x[0, B_y(t)], S^i_y[0, B_y(t)]]^T \quad \text{Formula (15)}$$

Using the spin polarization vector, the magnetic field $B^i_{1B,y}(S^i_y[0, B_y(t)])$ output from the one-axis optically pumped magnetometer that reads the spin polarization $S_y$ in the y direction can be calculated. This quantity would be zero in an ideal magnetometer and thus can be regarded as an error with respect thereto. That is, this value is the "crosstalk to the magnetic field Bx in the x direction" in the one-axis optically pumped magnetometer described above. Using the same response of the spin polarization, the magnetic field $B^i_{2B,x}(S^i_y[0, B_y(t)])$ output from the two-axis pumping magnetometer can be calculated according to the formula (12). This value is the "crosstalk to the magnetic field $B_x$ in the x direction" in the two-axis optically pumped magnetometer and is expressed as $B^i_{2B,x}(S^i[0, B_y(t)])$. To compare the magnitudes of the crosstalks, a root mean square sum of the values is determined as a representative value. For the one-axis optically pumped magnetometer, the quantity is expressed by the following formula (16).

$$\bar{\epsilon}_{1,x} = \sqrt{\langle (B_{1B,x}{}^i(S_y{}^i[0, B_y(t)]) - 0)^2 \rangle} \quad \text{Formula (16)}$$

For the two-axis optically pumped magnetometer, the quantity is expressed by the following formula (17).

$$\bar{\epsilon}_{2,x} = \sqrt{\langle (B_{2B,x}{}^i(S^i[0, B_y(t)]) - 0)^2 \rangle} \quad \text{Formula (17)}$$

For the magnetic field in the y direction obtained by calculation from the same spin, in the case of the one-axis optically pumped magnetometer, the one-axis optically pumped magnetometer is compared with a magnetometer arranged to read the spin polarization component $S_x$ in the x direction. That is, $B^i_{1B,y}(S^i_x[0, B_y(t)])$ ideally agrees with $B_y(t)$. The quantity is expressed by the following formula (18) as a root mean square sum of residuals of the signals.

$$\bar{\epsilon}_{1,y} = \sqrt{\langle (B_{1B,y}{}^i(S_x{}^i[0, B_y(t)]) - B_y(t_i))^2 \rangle} \quad \text{Formula (18)}$$

In the case of the two-axis optically pumped magnetometer, $B^i_{2B,y}(S^i_x[0, B_y(t)])$ is the output of the sensor for the magnetic field in the y direction. The quantity expressed by the following formula (19) is obtained as a root mean square sum of residuals of the signals.

$$\bar{\epsilon}_{2,y} = \sqrt{\langle (B_{2B,y}{}^i(S^i[0, B_y(t)]) - B_y(t_i))^2 \rangle} \quad \text{Formula (19)}$$

Although these quantities depend on the waveform of the magnetic field $B_y(t_i)$, an exemplary calculation thereof will be shown in order to grasp the magnitude relationship. As a test function, a waveform is considered: $B_y(t) = \Sigma_{n=1}{}^6 2 \sin(2\pi f_n t) \times 10^{-13}$. As calculation parameters, the slowdown factor q is 1.5, the optically pumped rate $R_{OP}$ is 200 s$^{-1}$, and the degree s of polarization of the pump light is 0.9. The calculation is performed by changing the transverse relaxation time $T_2$ and the magnitude of the resonance frequency $f_o$ determined by the bias magnetic field, that is, $\omega_0/2\pi = -\gamma B_z/2\pi$ as parameters. $T_2$ is changed from 3 ms to 100 ms, and $f_0$ is changed from 0.5 Hz to 100 Hz. The mean square sums of residuals in the y direction, $\epsilon_{1,y}$ and $\epsilon_{2,y}$ exhibit no remarkable dependency on these parameters and is about 0.004 pT to 0.009 pT.

Figure 9:
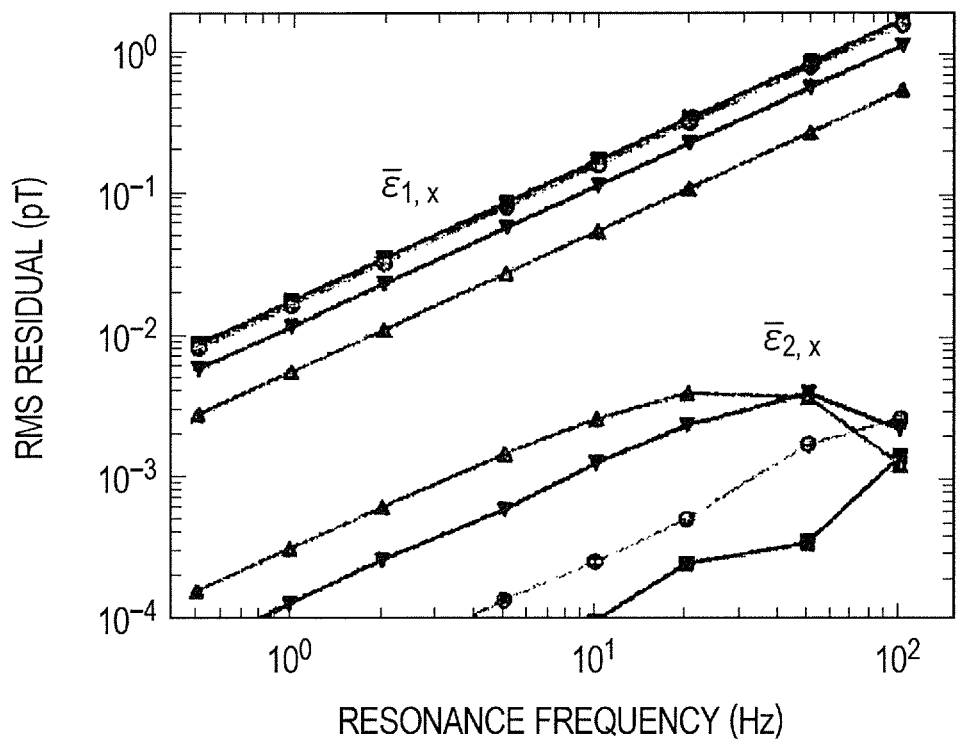
FIG. 9 is a graph illustrating signal distortions of a one-axis optically pumped magnetometer and a two-axis optically pumped magnetometer for comparison according to Reference example 2.

On the other hand, the magnitude of the crosstalk has a dependency on $T_2$ and $f_0$, and the dependency is shown in FIG. 9. Comparison between the crosstalk and the root mean square sum of residuals shows that $\epsilon_{2,x} < \epsilon_{2,y}$, and therefore the crosstalk poses no problem in the two-axis optically pumped magnetometer. On the other hand, for the one-axis optically pumped magnetometer, when $f_0$ is higher than 2 Hz, $\epsilon_{1,x} > \epsilon_{2,x}$, and therefore the crosstalk poses a problem. The crosstalk also poses a problem when $f_0$ is higher than 1 Hz, and $T_2$ is longer than 10 ms. In such parameter ranges, $\epsilon_{1,x} > \epsilon_{2,y}$, and the two-axis optically pumped magnetometer can more faithfully reproduce the original waveform than the one-axis optically pumped magnetometer, which is influenced by the crosstalk.

The advantage of the two-axis optically pumped magnetometer is also limited on the higher frequency side. When the Larmor frequency $\omega_0$ is adequately greater than the inverse $1/T_2$ of the transverse relaxation time, the formulas (11) for $\omega - \omega_0$ approximate to $h_1 - T_2$ and $h_2 - 1(i\omega_0)$. suggesting that the term of $h^1$ is adequately greater than the term of $h_2$. In this situation, $[S_x, S_y]$ is the same regardless of whether the magnetic field in the right side of the formula (10) is $$[B_x(t), 0]^T e^{i\omega t},$$

or $$[0, -iB_y(t)]^T e^{i\omega t}.$$

This formula means that the same spin polarization vector S occurs regardless of whether the applied magnetic field is $[B_x(t), 0]^T$ or $[0, -iB_y(t)]^T$, and the two magnetic fields cannot be discriminated from each other. In other words, as far as $\omega_0 \gg 1/T_2$, a rotating wave approximation that considers only the components of an oscillating magnetic field that rotate in the same direction as the spin polarization is effective, and the two-axis optically pumped magnetometer and the one-axis optically pumped magnetometer acquire the same information.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-026919, filed Feb. 10, 2012 and Japanese Patent Application No. 2012-097671, filed Apr. 23, 2012 which are hereby incorporated by reference herein in their entirety.

What is claimed is:

1. An optically pumped magnetometer acquiring an information as to strengths of magnetic fields in different two directions comprising:
   a cell including a group of alkali metal atoms;
   a pump light optical system configured to direct a pump light containing a circularly polarized component incident in the cell;
   a first probe light optical system configured to direct a first probe light containing a linearly polarized component so as to cross the pump light within the cell;
   a second probe light optical system configured to direct a second probe light containing a linearly polarized component so as to cross the pump light and the first probe light within the cell;
   a first detector configured to detect a rotation angle of the plane of polarization of the first probe light after passing through the cell;
   a second detector configured to detect a rotation angle of the plane of polarization of the second probe light after passing through the cell;
   a magnetic field applying unit configured to apply a static magnetic field within the cell; and
   a calculating unit configured to calculate the information as to the strengths of magnetic fields in the different two directions respectively vertical to the direction of the static magnetic field applied by the magnetic field applying unit within the cell, based on the rotation angle detected by the first detector and the rotation angle detected by the second detector.

2. The optically pumped magnetometer according to claim 1, wherein
   the calculating unit calculates the information as to the strengths of magnetic fields in the different two directions, by solving Bloch equation, based on sampled data of the rotation angle detected by the first detector and the rotation angle detected by the second detector, under an estimation of a spin polarization in a direction of the applied static magnetic field as being constant.

3. The optically pumped magnetometer according to claim 1, wherein
   the calculating unit calculates the information as to the strengths of magnetic fields in the different two directions, by formulating a block of continuous N-data, based on sampled data of the rotation angle detected by the first detector and the rotation angle detected by the second detector, to determine, according to a predetermined algorithm, a representative rotation angle in the block and a differential coefficient of the representative rotation angle.

4. The optically pumped magnetometer according to claim 3, wherein
   the predetermined algorithm is a least-square method, or a weighted averaging method.

5. The optically pumped magnetometer according to claim 1, wherein
   the calculating unit comprises
   a first calculating unit configured to calculate a frequency spectrum of the rotation angle detected by the first detector and a frequency spectrum of the rotation angle detected by the second detector, based on the rotation angle detected by the first detector and the rotation angle detected by the second detector; and
   a second calculating unit configured to calculate, under an estimation of a spin polarization in a direction of the applied static magnetic field as being constant, the information as to the strengths of magnetic fields in the different two directions, based on the frequency spectrum of the rotation angle detected by the first detector and the frequency spectrum of the rotation angle detected by the second detector, and based on an eigen solution of Bloch equation.

6. The optically pumped magnetometer according to claim 5, wherein
   the second calculating unit performs a processing to acquire a moving average and an average rate of change among 3 or more of time series of signals derived by the first or second probe light.

7. The optically pumped magnetometer according to claim 5, wherein
   the first probe light and second probe light passing though the cell return by a mirror arranged in a path of the first probe light and second probe light.

8. A magnetic sensing method for acquiring an information as to strengths of magnetic fields in different two directions comprising steps of:
   directing a pump light containing a circularly polarized component, a first probe light containing a linearly polarized component and a second probe light containing a linearly polarized component, to form a crossing region there between in a cell including a group of alkali metal atoms;
   applying, by magnetic field applying unit, a static magnetic field in a direction of the pump light incident in the crossing region, during the directing the pump light, the first probe light and the second probe light; and
   calculating the information as to strengths of magnetic fields in the different two directions vertical to the direction of the static magnetic field applied by the magnetic field applying unit within the cell, based on the rotation angle of the plane of polarization of the first probe light and the rotation angle of the plane of polarization of the second probe light during passing through the cell.

9. The magnetic sensing method according to claim 8, wherein
   the step of calculating the information as to the strengths of magnetic fields in the different two directions is performed, by solving Bloch equation, based on sampled data of the rotation angle of the polarization plane of the first probe light and the rotation angle of the polarization plane of the second probe light, under an estimation of a spin polarization in a direction of the static magnetic field.

10. The magnetic sensing method according to claim 8, wherein
    the step of calculating the information as to the strengths of magnetic fields in the different two directions is performed, by formulating a block of continuous N-data, based on sampled data of the rotation angle of the polarization plane of the first probe light and of the polarization plane of the second probe light, to determine, according to a predetermined algorithm, a representative rotation angle in the block and a differential coefficient of the representative rotation angle.

11. The magnetic sensing method according to claim 10, wherein
the predetermined algorithm is a least-square method, or a weighted averaging method.

12. The magnetic sensing method according to claim 8, wherein
the step of calculating the information as to the strengths of magnetic fields in the different two directions comprises:
a first calculating step of calculating a frequency spectrum of the rotation angle of the polarization plane of the first probe light and a frequency spectrum of the rotation angle of the polarization plane of the second probe light, based on the rotation angles of the polarization planes of the first and second probe lights; and
a second calculating step of calculating the information as to the strengths of magnetic fields in the different two directions, under an estimation of a spin polarization in a direction of the applied static magnetic field as being constant, based on the frequency spectrum of the rotation angle of the polarization plane of the first probe light, the frequency spectrum of the rotation angle of the polarization plane of the second probe light, and based on an eigen solution of Bloch equation.

13. The magnetic sensing method according to claim 12, wherein
the second calculating step includes a processing to acquire a moving average and an average rate of change among 3 or more of time series of signals derived by the first or second probe light.

14. A recording medium storing a computer readable program for acquiring an information is readable, wherein the program operates the computer to execute a magnetic sensing method for acquiring an information as to strengths of magnetic fields in different two directions comprising steps of:
directing a pump light containing a circularly polarized component, a first probe light containing a linearly polarized component and a second probe light containing a linearly polarized component, to form a crossing region therebetween in a cell including a group of alkali metal atoms;
applying, by magnetic field applying unit, a static magnetic field in a direction of the pump light incident in the crossing region, during the directing the pump light, the first probe light and the second probe light; and
calculating the information as to strengths of magnetic fields in the different two directions vertical to the direction of the static magnetic field applied by the magnetic field applying unit within the cell, based on the rotation angle of the plane of polarization of the first probe light and the rotation angle of the plane of polarization of the second probe light during passing through the cell.

* * * * *